United States Patent
Pereira et al.

(10) Patent No.: US 10,782,727 B2
(45) Date of Patent: Sep. 22, 2020

(54) INTEGRATED CIRCUITS HAVING SELF-CALIBRATING OSCILLATORS, AND METHODS OF OPERATING THE SAME

(71) Applicant: Texas Instruments Incorporated, Dallas, TX (US)

(72) Inventors: Angelo William Pereira, Allen, TX (US); Pinar Korkmaz, Allen, TX (US); Sujan Kundapur Manohar, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 9 days.

(21) Appl. No.: 16/194,784

(22) Filed: Nov. 19, 2018

(65) Prior Publication Data

US 2020/0159278 A1 May 21, 2020

(51) Int. Cl.
*H03K 3/00* (2006.01)
*G06F 1/04* (2006.01)
*H03B 5/06* (2006.01)
*H03L 7/099* (2006.01)
*H03K 3/027* (2006.01)

(52) U.S. Cl.
CPC ............. *G06F 1/04* (2013.01); *H03B 5/06* (2013.01); *H03K 3/027* (2013.01); *H03L 7/0991* (2013.01)

(58) Field of Classification Search
CPC ......... G06F 1/04; H03L 7/0991; H03K 3/027; H03B 5/06
USPC ........................................................ 327/291
See application file for complete search history.

(56) References Cited

U.S. PATENT DOCUMENTS

| | | | | |
|---|---|---|---|---|
| 5,070,311 A | * | 12/1991 | Nicolai | G06F 1/08 331/108 C |
| 5,699,024 A | * | 12/1997 | Manlove | H03K 3/0231 331/111 |
| 6,060,920 A | | 5/2000 | Saeki | |
| 6,124,764 A | * | 9/2000 | Haartsen | H03J 7/06 327/106 |
| 6,570,402 B2 | * | 5/2003 | Koo | G05F 1/565 326/12 |
| 7,138,880 B2 | * | 11/2006 | Ma | H03K 3/013 331/143 |
| 7,626,430 B2 | | 12/2009 | Motoyui | |
| 7,746,130 B2 | | 6/2010 | Chang | |
| 8,044,690 B2 | | 10/2011 | Patel et al. | |

(Continued)

OTHER PUBLICATIONS

Smedt et al., "A 66 uW 86 ppm/ C Fully-Integrated 6 MHz Wienbridge Oscillator With a 172 dB Phase Noise FOM," IEEE Journal of Solid-State Circuits, vol. 44, No. 7, Jul. 2009, pp. 1990-2001.

(Continued)

*Primary Examiner* — Ryan Jager
(74) *Attorney, Agent, or Firm* — Michael A. Davis, Jr.; Charles A. Brill; Frank D. Cimino

(57) ABSTRACT

Integrated circuits having self-calibrating oscillators, and methods of operating the same are disclosed. A disclosed example integrated circuit includes a clock generator, a comparator having a first input connected to an output of the clock generator and a second input connected to a reference voltage, a calibration done detector having an input connected to an output of the comparator and an output communicatively coupled to a calibration code register.

23 Claims, 8 Drawing Sheets

(56) References Cited

U.S. PATENT DOCUMENTS

| | | | | |
|---|---|---|---|---|
| 8,085,099 | B2* | 12/2011 | Pancholi | H03K 4/502 331/14 |
| 8,988,157 | B2* | 3/2015 | Tokairin | H03K 4/502 331/1 R |
| 9,344,070 | B2 | 5/2016 | Luan et al. | |
| 10,367,484 | B2 | 7/2019 | Zhao et al. | |
| 2019/0028106 | A1* | 1/2019 | Annema | H03L 7/083 |

OTHER PUBLICATIONS

Sundaresan et al., "Process and Temperature Compensation in a 7-MHz CMOS Clock Oscillator," IEEE Journal of Solid-State Circuits, vol. 41, No. 2, Feb. 2006, pp. 433-442.

Soldera et al., "A temperature compensated CMOS relaxation oscillator for low power applications," 2012 25th Symposium on Integrated Circuits and Systems Design (SBCCI), 4 pages.

Zhang et al., "A 3.2ppm/C Second-Order Temperature Compensated CMOS On-Chip Oscillator Using Voltage Ratio Adjusting Technique," Symposium on VLSI Circuits Digest of Technical Papers, 2017, 2 pages.

Wang et al., "A Compact CMOS Ring Oscillator with Temperature and Supply Compensation for Sensor Applications," IEEE Computer Society Annual Symposium on VLSI, 2014, pp. 267-272.

Lee et al., "A 10MHz 80uW 67 ppm/C CMOS Reference Clock Oscillator with a Temperature Compensated Feedback Loop in 0.18um CMOS," Symposium on VLSI Circuits Digest of Technical Papers, 2009, pp. 226-227.

De Vita et al., "Low-Voltage Low-Power CMOS Oscillator with Low Temperature and Process Sensitivity," 2007 IEEE International Symposium on Circuits and Systems, May 27-30, 2007, pp. 2152-2155.

Lu et al., "A Low Power Relaxation Oscillator with Process Insensitive Auto-Calibration Scheme," 2016 IEEE Asia Pacific Conference on Circuits and Systems (APCCAS), Jan. 5, 2017, pp. 694-697.

Mikulic et al., "Relaxation Oscillator Calibration Technique with Comparator Delay Regulation," 2016 39th International Convention on Information and Communication Technology, Electronics and Microelectronics (MIPRO), May 30-Jun. 3, 2016, pp. 57-61.

Aita et al., "A 0.45V CMOS Relaxation Oscillator with +2.5% Frequency Stability from −55C to 125C," 2015 IEEE International Symposium on Circuits and Systems (ISCAS), May 24-27, 2015, pp. 493-496.

Wang et al. "A 12/7-MHz 31 ppm/C On-Chip RC Relaxation Oscillator With Digital Compensation Technique," IEEE Transactions on Circuits and Systems—I: Regular Papers, vol. 63, No. 11, Nov. 2016, pp. 1816-1824.

Lu et al., "A high linearity current-controlled CMOS relaxation oscillator with frequency self-calibration technique," Analog Integr Circ Sig Process, (2017) 92:29-37.

Han et al., "A Self-Calibration Technique for On-Chip Precise Clock Generator," IEEE Transactions on Circuits and Systems—II: Express Briefs, vol. 62, No. 12, Dec. 2015, pp. 1114-1118.

* cited by examiner

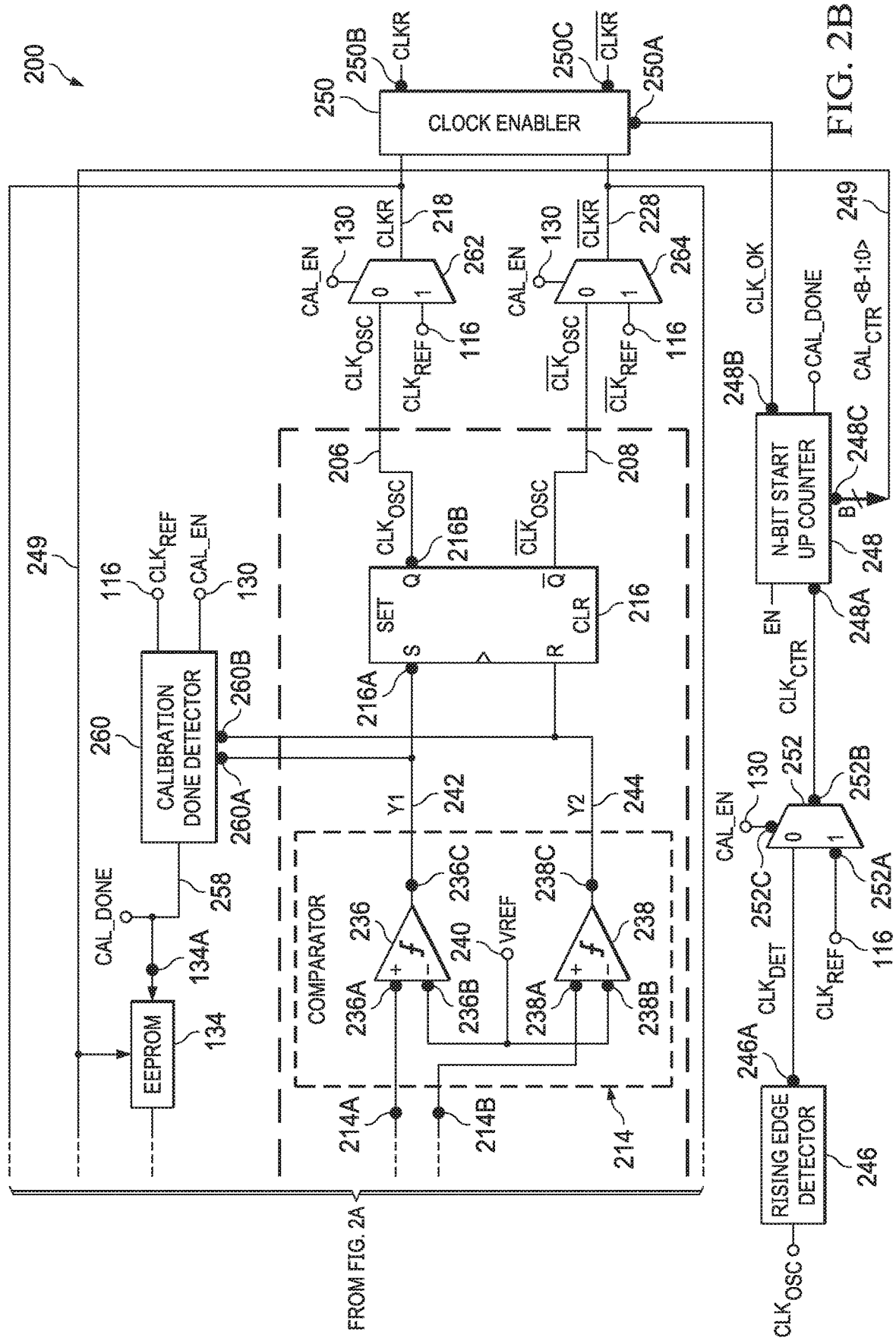

INTEGRATED CIRCUITS HAVING SELF-CALIBRATING OSCILLATORS, AND METHODS OF OPERATING THE SAME

FIELD OF THE DISCLOSURE

This disclosure relates generally to oscillators, and, more particularly, to integrated circuits having self-calibrating oscillators, and methods of operating the same.

BACKGROUND

Due to process variations, component tolerances, temperature, voltage sensitivity, etc. an integrated oscillator that is untrimmed or uncalibrated may vary from its intended operating frequency by as much as twenty-five to fifty percent over six standard deviations from the mean. The cumulative error results from errors in voltage, and/or current references as well as passive component tolerances on chip.

BRIEF DESCRIPTION OF THE DRAWINGS

FIGS. 2A and 2B are a schematic of an example circuit that may be used to implement the example self-calibrating oscillator of FIG. 1.

Figure 1:
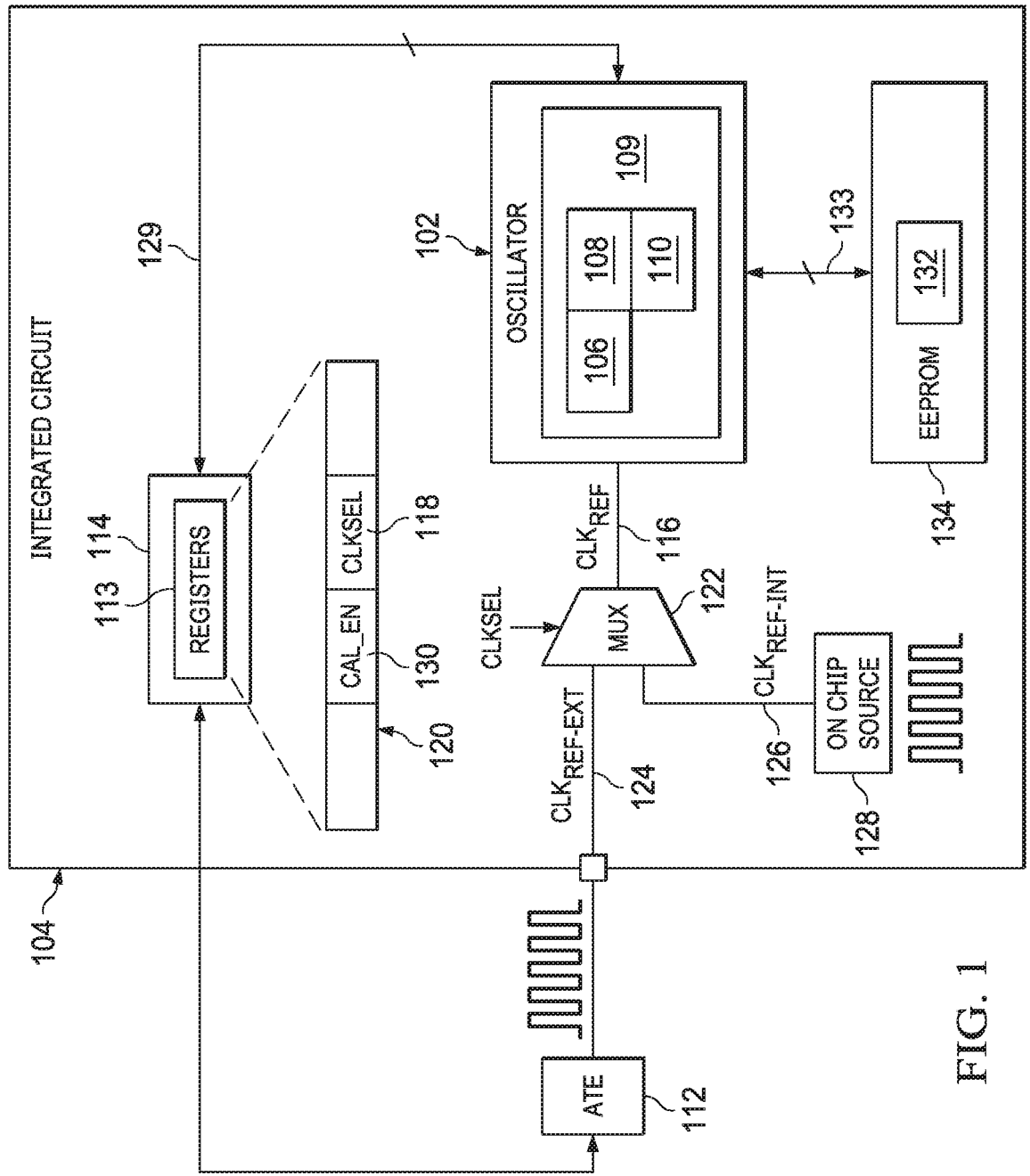
FIG. 1 illustrates an example integrated circuit having a self-calibrating oscillator constructed in accordance with an aspect of the present disclosure, and shown in an example environment of use.

In general, the same reference numbers will be used throughout the drawing(s) and accompanying written description to refer to the same or like parts. Connecting lines or connectors shown in the various figures presented are intended to represent example functional relationships and/or physical or logical couplings between the various elements.

DETAILED DESCRIPTION

The majority of power management integrated circuits (PMIC) (include one or more oscillators for the purpose of, for example, time keeping, sequencing, wake-up, providing a master clock for an integrated circuit including the oscillator, providing a master clock for another integrated circuit, providing a clock for a switching regulator, etc. After fabrication, oscillators may experience manufacturing variations and may have varying frequencies that exhibit a Gaussian, or a Normal distribution about a mean value. The mean value is generally close to a target value of the oscillators by design. The distribution characterized by standard deviations or percentiles could be wide enough that oscillators with frequencies falling within the tail ends of the distribution may have performance degradation issues. The performance degradation may be compounded by frequency errors due to transistor and/or passive component sensitivities that vary with temperature and/or supply voltage. Frequency error over temperature depends on the relative temperature coefficients of the transistor and passive components, and correlations between them. An example oscillator is a relaxation oscillator that generates a changing voltage at a particular frequency by charging and discharging a capacitor through a resistor. A relaxation oscillator has a nominal frequency F=IREF/(C*VREF) that depends on the accuracy of current (IREF), reference voltage (VREF), and capacitor (C).

Oscillators can be trimmed (e.g., after fabrication at a semiconductor vendor site), and/or calibrated (e.g., in an actual use environment (such as a phone, electrical appliance or an automobile ECU)) so they oscillate at their intended operating frequency. For example, the amount of current output by current source(s) of an oscillator, and/or the capacitance(s) of an array of capacitors may be adjusted until the oscillator oscillates within a predetermined tolerance of its intended operating frequency. The adjustments to current, capacitance, etc. described herein may be implemented by using the adjustments to trim (e.g., physically blowing a fuse) and/or calibrate (e.g., setting a current reference, a voltage reference, etc.) an oscillator. The described calibration codes can be used to set a current reference, set a voltage reference, determine trim parameters (e.g., which component(s) to trim and in which way(s)), etc. In some examples, trim information is determined by the oscillator and fed to an off chip device that trims the oscillator. Accordingly, examples disclosed herein can be used to perform calibration as well as trim. Thus, for readability, references will be made to self-calibration rather than to self-calibration and self-trim, and to calibration codes rather than to trim codes and calibration codes. In some examples, a self-calibrating oscillator refers an oscillator including the additional circuits disclosed herein that is able to select, identify, etc. its own calibration code without need for an external clock measurement circuit.

In the case of safety devices, automotive safety integrity level (ASIL)-A/B/C/D standards require redundant oscillators, thereby increasing the number of oscillators that must be calibrated per device. In conventional approaches, an integrated circuit including an oscillator is configured to output a clock that is monitored by automated test equipment (ATE). The ATE runs a test program that is used to sweep a control bus (or buses) that vary one or more internal parameters of the oscillator until a target frequency is obtained. During this process, such equipment uses instruments to measure frequency for each oscillation cycle, averages such frequency measurements to measure the operating frequency of the oscillator for each sweep step.

An example conventional trim methodology for oscillators with four or five bits of trim would sweep a selection of sixteen to thirty-two possible trim settings or values through an oscillator to determine an optimal (e.g., best) trim setting. The time to trim a conventional oscillator can be expressed as a time on the order of:

$$\text{trim\_time} = 2^N \text{ sweep\_time} + 2^N \text{ stabilization\_time\_seconds} + 2^N \text{ control\_time\_seconds},$$

where:
- N is the number of bits being trimmed (e.g., four or five),
- sweep_time_seconds is the time to increment (e.g., by one) a trim bus (e.g., a control bus) that varies a component and/or electrical quantity on-chip,
- stabilization_time_seconds is the time needed for the oscillator to reach a steady state after a trim value is selected, and
- control_time_seconds is the time to write a control register of the integrated circuit (e.g., write a new set of trim bits, etc.).

In practice, an example trim time is eighty to one hundred milliseconds (ms) per oscillator. The dominant contributor to the time required to trim precision oscillators is control_time, which is determined by how fast the communication interface between the device under test and the ATE operates. Some reduction in trim time may be obtained by: (a) using binary search to reduce how may codes are swept, (b) using adaptive search to reduce the number of codes swept, (c) intelligently predicting the best starting sweep values from prior devices that were tested in the immediate past of the present unit under test. However, there is a lower bound to how much reduction in test time may be obtained by such methods. Some methods, like binary search, may save control_time but may cause increase in stabilization_time. Further some methods require the presence of the ATE and therefore are not suitable if the oscillator were to be re-calibrated while in the use environment.

The present disclosure introduces self-calibrating oscillators and methods to self-calibrate oscillators that reduce the complexity of oscillator circuitry, manufacturing expenses, and time to calibrate oscillators are disclosed herein. Reference will now be made in detail to non-limiting examples, some of which are illustrated in the accompanying drawings.

FIG. 1 illustrates an example self-calibrating oscillator 102 constructed in accordance with an aspect of the present disclosure, and shown in an example environment of use in the form of an example integrated circuit 104. Analog and digital circuits and devices 106 of the example self-calibrating oscillator 102 that form part of the self-calibrating oscillator 102 in its normally operating mode together with a small number of additional gates 108 (e.g., less than one hundred logic gates) that form a compact circuit that calibrates the operating frequency of the self-calibrating oscillator 102. Instead of measuring an operating frequency of an oscillator and using the measured frequency to calibrate the self-calibrating oscillator 102, as is in done in conventional oscillator calibration, the example circuits and devices 106, and the gates 108 of FIG. 1 form a simple self-calibration circuit 109 (e.g., an autonomous calibration circuit, etc.) for the self-calibrating oscillator 102 that measures voltage VCAP1 202 and voltage VCAP2 204 (see FIGS. 2A and 2B) representative of the operating frequency of a clock generator circuit 110 of the self-calibrating oscillator 102. Eliminating operating frequency measurement, eliminates the need for a complex frequency measurement circuit in the integrated circuit 104 and/or in an ATE 112. Disclosed example self-calibration circuits 109 account and correct for, among other things, bias current variation, capacitor variation, comparator offset, propagation delay, etc.

In the illustrated example of FIG. 1, the ATE 112 controls calibrating of the self-calibrating oscillator 102 by reading and/or writing registers 113 in on-chip digital logic 114 of the integrated circuit 104 using, for example, Inter-Integrated Circuit (I2C) and/or Serial Peripheral Interface (SPI) communications. While conventional oscillator trimming requires multiple register writes and/or reads (e.g., multiple calibration code writes, etc.) only a single register write (e.g., calibration start) is required in the examples disclosed herein to start an oscillator self-calibration mode of operation. While an oscillator is performing self-calibration, the ATE 112 is free to perform other processes. Moreover, the self-calibrating oscillator 102 can perform a self-calibration at the same time as other oscillators of the same or different devices. These and/or other aspects of disclosed examples allow the oscillators on a wafer to be calibrated as much as hundreds of times faster than using prior techniques, with costs savings of hundreds of thousands of dollars per year. Further, the presence of a second oscillator on-chip or off-chip along with appropriate hardware also permits an oscillator to be re-calibrated and/or re-trimmed in the field without the need for an ATE or similar expensive and intrusive equipment. In the field, re-calibration and/or re-trim may be performed at any time. For example, during an active operation, during sleep, during idle time, at startup, on command, etc.

As described below in connection with the example of FIGS. 2A and 2B, the example self-calibrating oscillator 102 of FIG. 1 performs a self-calibration based on a received reference clock $CLK_{REF}$ 116. In the illustrated example of FIG. 1, the example ATE 112 selects the reference clock $CLK_{REF}$ 116 by setting an example CLKSEL bit 118 of a register 120. The example CLKSEL bit 118 controls an example multiplexer 122 to output: (1) an external reference clock $CLK_{REF-EXT}$ 124 provided by, for example, the ATE 112, or (2) an internal reference clock $CLK_{REF-INT}$ 126 provided by, for example, an on-chip clock source 128 such as a relaxation oscillator, a ring oscillator, a crystal oscillator, etc.

To initiate a self-calibration operation, the example ATE 112 sets a CAL_EN bit 130 of the register 120. In response to the CAL_EN bit being set, the self-calibrating oscillator 102 performs a self-calibration. The self-calibrating oscillator 102 is communicatively coupled to and interacts with the on-chip digital logic 114 to access the registers 113 of the on-chip digital logic 114 via, for example, a control bus 129. The self-calibrating oscillator 102, among other things, provides selected calibration code(s) to the on-chip digital logic 114. Registers in turn communicate with the self-calibrating oscillator 102, and receive the calibration code information from self-calibrating oscillator 102. In some examples, the on-chip digital logic 114 controls how to store and burn the optimal calibration code(s) into the EEPROM 134.

In disclosed examples, the ATE 112 only needs to provide the external reference clock $CLK_{REF-EXT}$ 124 that is readily available on conventional test equipment. The external reference clock $CLK_{REF-EXT}$ 124 can be a simple short duration clock (e.g., it does not need to be continuously available). In some examples, the reference clock $CLK_{REF}$ 116 is a 50% duty cycle clock. Using disclosed examples, oscillator calibration times can be reduced from an order of 100 milliseconds to an order of tens of microseconds (μs) for a 4 MHz oscillator having between sixty-four and one hundred twenty-eight possible calibration codes.

In some examples, shorter calibration times allow an oscillator to be calibrated on-the-fly using the on-chip trimmed internal reference clock $CLK_{REF-INT}$ 126 so two clock sources can track each other or to the reference clock with less drift over time. For example, if the reference clock is a more accurate time clock source (e.g., a crystal clock), it can be routed for just $2^N$*sweep_time seconds, where N is the number of trim bits, to the oscillator under calibration. With self-calibrating operation, on-chip digital logic 114 can be in standby and/or low power mode during calibration, and only wake up when calibration is complete. The calibration completion could be realized using interrupts that wake up the digital core to receive the optimal calibration code from the oscillator.

To store calibration codes (e.g., an operating calibration code 132), in addition to other information and/or data, the example integrated circuit 104 includes a machine-readable memory, a machine-readable storage device, etc. such as a non-volatile storage device or memory (e.g., an electronically erasable programmable read-only memory (EEPROM) 134). During an example startup phase of a clock-generation mode of operation, the example self-calibrating oscillator 102 reads the operating calibration code(s) 132 from the EEPROM 134 over a calibration (e.g., control) bus 133, and uses the operating calibration code(s) 132 to set output(s) of a current source, a resistor, a capacitor value, a resistor array, a capacitor array, a combination thereof, etc. During an example self-calibration mode of operation, the self-calibrating oscillator 102 identifies the calibration code(s) 132 that results in an operating frequency that is nearest (e.g., approximately, close to, closest to, etc.) a target operating frequency, and writes the calibration code(s) 132 into the EEPROM 134 over the calibration (e.g., control) bus 133 for subsequent retrieval.

In the case of safety devices, automotive safety integrity level (ASIL)-A/B/C/D standards require redundant oscillators, thereby increasing the number of oscillators that must be calibrated per integrated circuit. In some such examples, a first self-calibration oscillator performs a self-calibration. A second self-calibration oscillator is placed in calibration enable mode (e.g., continuously, periodically, aperiodically, etc.) and uses the first self-calibration oscillator as an on chip clock source 128 to provide the internal reference clock $CLK_{REF-INT}$ 126 for the second self-calibration oscillator, thereby the second oscillator tracks the first oscillator over time.

Figure 2A:
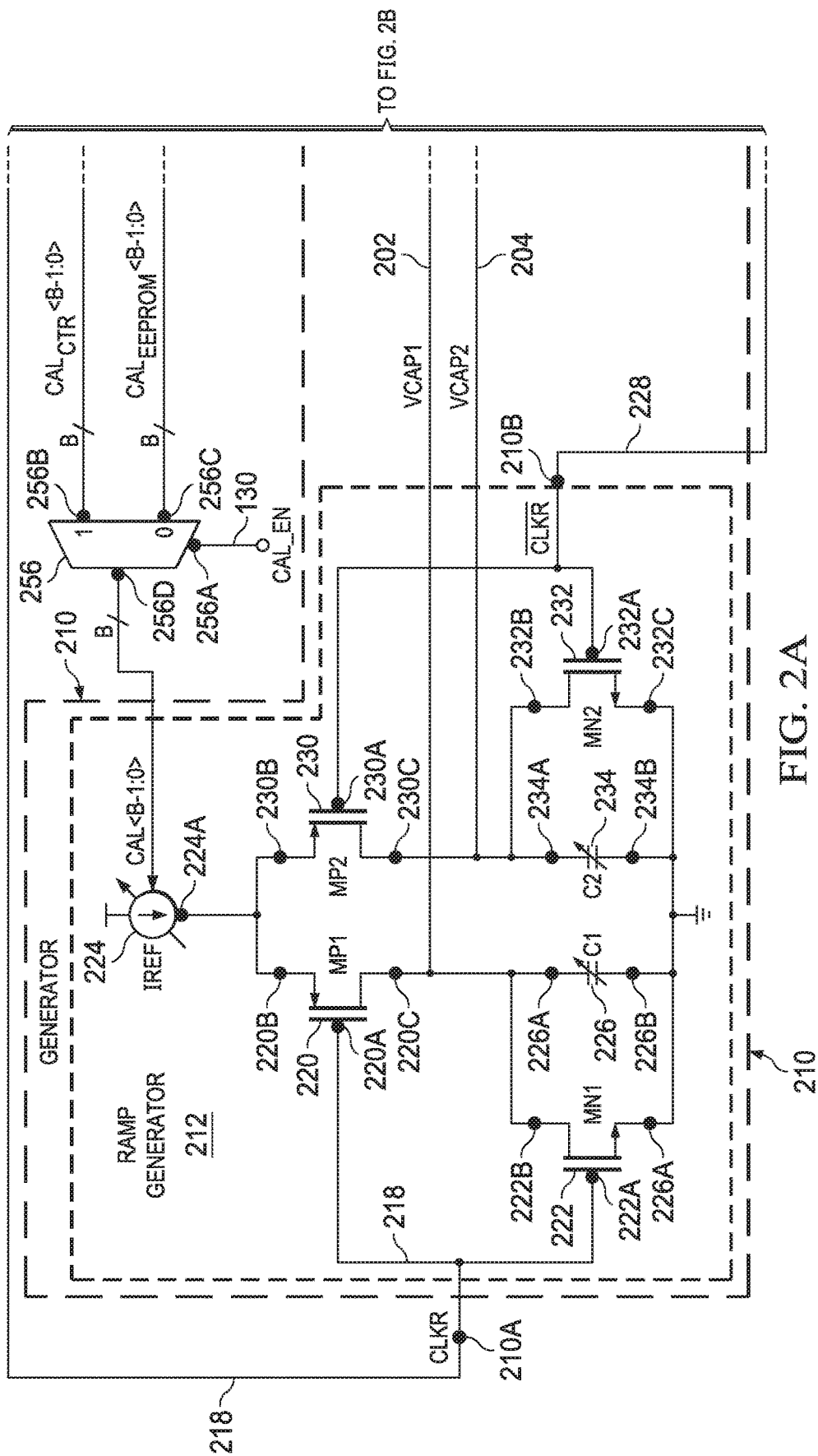

FIGS. 2A and 2B is a drawing illustrating an example schematic of an example self-calibrating oscillator 200 that may be used to implement the example self-calibrating oscillator 102 of FIG. 1. To generate complementary clock signals $CLK_{OSC}$ 206 and $\overline{CLK_{OSC}}$ 208, the example self-calibrating oscillator 200 includes an example generator circuit 210. The example generator circuit 210 of FIG. 2 may be used for the example clock generator circuit 110 of FIG. 1. The example generator circuit 210 of FIG. 2 is a dual capacitor, relaxation oscillator, although the disclosures made herein may be used with other forms of oscillators such as an RC oscillator, or a ring oscillator, possibly with suitable modifications to permit the measurement of voltage, capacitance, and/or current instead of a direct frequency measurement used in conventional techniques. The example generator circuit 210 of FIGS. 2A and 2B includes an example ramp generator 212, an example comparator circuit 214, and an example latch 216.

In the illustrated example of FIGS. 2A and 2B, an output clock signal CLKR 218 is coupled via a terminal 210A of the generator circuit 210 to a gate terminal 220A of a transistor MP1 220 and to a terminal 222A of a transistor MN1 222. An output terminal 224A of an adjustable current source 224 is coupled to a terminal 220B of the transistor MP1 220. A terminal 220C of the transistor MP1 220 is coupled to a terminal 222B of the transistor MN1 222 and a terminal 226A of a capacitor C1 226. A terminal 222C of the transistor 222 and a terminal 226B of the capacitor C1 are coupled to ground or negative supply rail VSS.

A complementary clock signal $\overline{CLKR}$ 228 is coupled via a terminal 210B of the generator circuit 210 to a terminal 230A of a transistor MP2 230 and to a terminal 232A of a transistor MN2 232. The output terminal 224A of the adjustable current source 224 is coupled to a terminal 230B of the transistor MP2 230. A terminal 230C of the transistor MP2 230 is coupled to a terminal 232B of the transistor MN2 232 and a terminal 234A of a capacitor C2 234. A terminal 232C of the transistor 232 and a terminal 214B of the capacitor C2 are coupled to ground. Additionally, and/or alternatively, adjustable array(s) of capacitors (not shown) are coupled to the transistor MP1 220 and the transistor MP2 230 to calibrate the operating frequency of the ramp generator 212.

Figure 3:
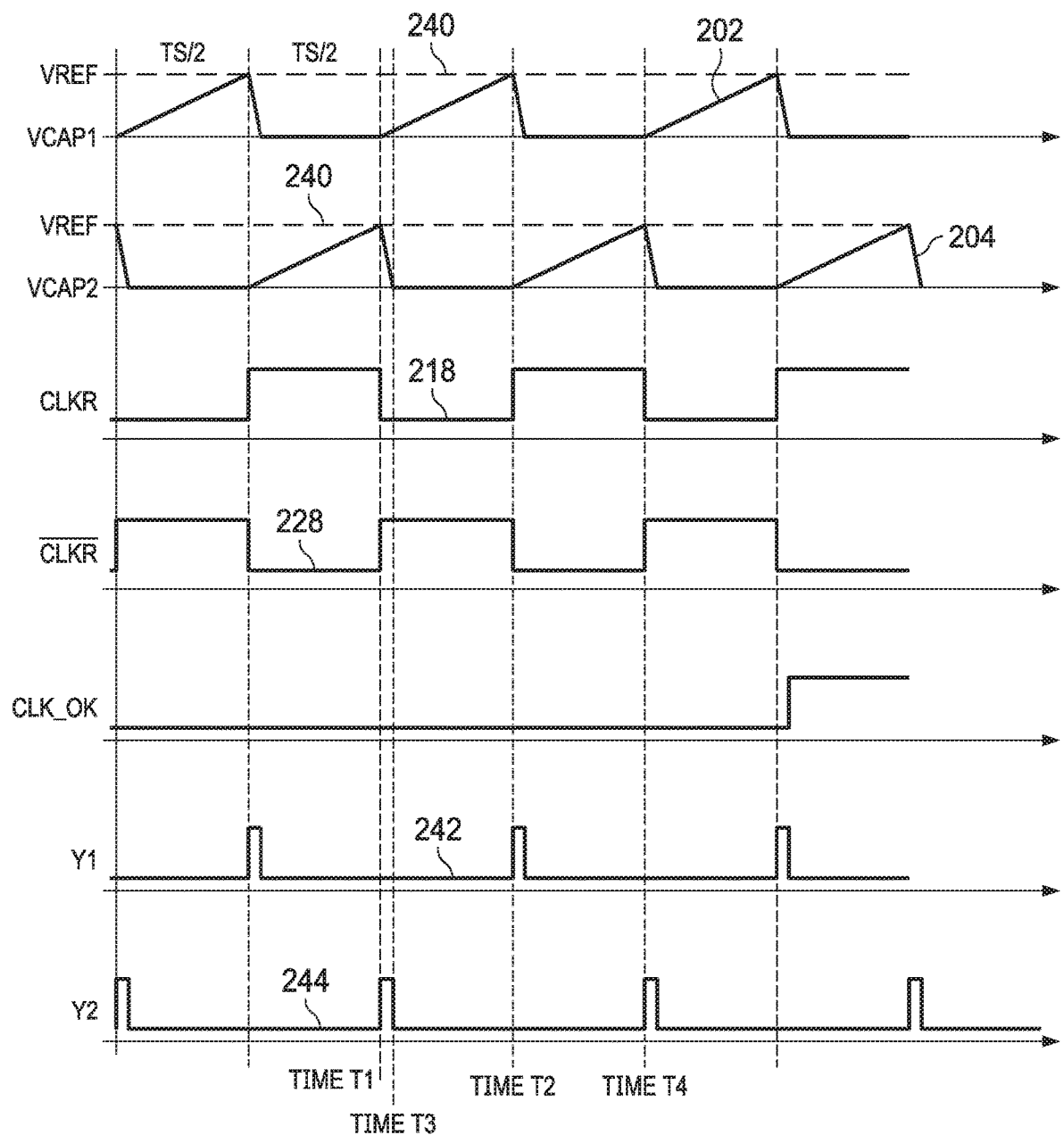
FIG. 3 is a graph of example signals illustrating an example clock-generation mode of operation of the example self-calibrating oscillator of FIG. 1, and/or FIGS. 2A and 2B.

In an example clock-generation mode of operation shown in FIG. 3, when the output clock signal CLKR 218 becomes low (e.g., has a logic value of "1") near time T1, it causes the transistor MP1 220 to close and the transistor MN1 222 to open, thereby allowing current generated by the adjustable current source 224 to charge the capacitor C1 226 causing a voltage VCAP1 202 at a terminal 214A of the comparator circuit 214 to linearly increase between time T1 and time T2. At around the same time T1, the complementary clock signal $\overline{CLKR}$ 228 becomes high (e.g., has a logic value of "1") causing the transistor MP2 230 to open and the transistor MN2 232 to close, thereby allowing the capacitor C2 234 to discharge through MN2 232 to ground, causing the voltage VCAP2 204 at a terminal 214B of the terminal 214B to linearly decrease between time T1 and time T3. In some examples, the discharge is not linear as it is not controlled by a current source.

The terminal 214A is coupled to a terminal 236A of a comparator 236 of the comparator circuit 214, and the terminal 214B is coupled to a terminal 238A of a comparator 238 of the comparator circuit 214. Additional respective terminals 236B and 238B of the comparators 236 and 238 are coupled to a reference voltage VREF 240. While the output clock signal CLKR 218 is low, the voltage VCAP1 202 increases and the voltage VCAP2 204 decreases quickly to ground. When the voltage VCAP1 202 satisfies a threshold (e.g., exceeds the reference voltage VREF 240) at time T2, the output Y1 242 on a terminal 236C of the comparator 236 changes from low (e.g., a logic value of "0") to high (e.g., a logic value of "1").

The terminal 236C of the comparator 236 is coupled to a terminal 216A of the latch 216. The latch 216 generates the oscillating output clock signals CLKR 218 and $\overline{CLKR}$ 228 responsive to respective outputs Y1 242 and Y2 244 of the comparators 236 and 238. When, the output Y1 242 changes from low to high at time T2, the latch 216 is set and its Q output terminal 216B is set to high (e.g., a logic value of "1"). As will be described below, during a clock-generation mode of operation, the value of the CAL_EN bit 130 (see FIG. 1) will be low (e.g., a logic value of "0") and, thus, the output clock signal CLKR 218 changes from low to high at time T2 when the latch 216 changes from low to high. When the output clock signal CLKR 218 changes from low to high at time T2, the ramp generator 212 starts to increase at time T2 the voltage VCAP2 204 while the voltage VCAP1 202 decreases quickly to ground starting at time T2. When eventually voltage VCAP2 204 exceeds the reference voltage VREF 240 at time T4, an output Y2 244 on a terminal 238C of the comparator 238 changes from low (e.g., a logic value of "0") to high (e.g., a logic value of "1") at time T4. When, the output Y2 244 changes from low to high at time T4, the latch 216 is reset and its Q output terminal 216B is reset to low (e.g., a logic value of "0"), which sets the output clock signal CLKR 218 from high to low at time T4, and the process described above repeats thereby forming the oscillating output clock signals CLKR 218 and CLKR 228.

To reduce (e.g., mitigate, obviate, eliminate, etc.) startup transients, the example self-calibrating oscillator 200 of FIGS. 2A and 2B includes a rising edge detector 246, a calibration code generator in the form of a counter 248, and a clock enabler 250. As will be described below, during a clock-generation mode of operation, the value of the CAL_EN bit 130 will be low (e.g., a logic value of "0"). Accordingly, during the clock-generation mode of operation a clock input terminal 248A of the counter 248 is coupled via a multiplexer 252 to an output terminal 246A of the rising edge detector 246. An output terminal 248B of the counter 248 is coupled to an input terminal 250A of the clock enabler 250. When an input on the input terminal 250A is high (e.g., a logical value of "1") or had a rising edge occur, the oscillating output clock signals CLKR 218 and CLKR 228 are output at terminals 250B and 250C. When a predetermined number (e.g., sixteen to thirty-two) of rising edges of the clock signal CLK$_{OSC}$ 206 have occurred, the counter 248 triggers the clock enabler 250 to provide the oscillating output clock signals CLKR 218 and CLKR 228 at the terminals 250B and 250C. For example, as shown in illustrated example of FIG. 3, the CLK_OK signal goes high on the third rising edge of output clock signal CLKR 218.

The example comparator circuit 214, the example latch 216, and the example counter 248, which are part of (used by) the example self-calibrating oscillator 200 in its normally operating mode, may be reused to form the example analog and digital circuits and devices 106 of FIG. 1.

To adjust the operating frequency of the generator circuit 210, the example adjustable current source 224 of FIG. 1 has an adjustable output current, and/or an adjustable capacitor array (not shown) having an adjustable capacitance. The larger the amount of current output by the adjustable current source 224, the higher the operating frequency of the generator circuit 210. The amount of current generated by the adjustable current source 224 is controlled by writing one of a plurality of successive trial calibration codes (e.g., a plurality a B-bit digital words). In conventional approaches, during assembly and test an ATE successively writes calibration codes to a current source to identify the best calibration code. The active calibration code (e.g., the code current used by the adjustable current source 224) that results in an operating frequency that is near, close to, approximately, closest to, etc. to an intended operating frequency) is then stored in an EEPROM 134 as an operating calibration code for subsequent recall and use in a clock-generation mode operation. As will be described below, during clock generation, the value of the CAL_EN bit 130 will be low (e.g., a logic value of "0"), and a calibration code stored in the EEPROM 134 (regardless of how it was determined) will be obtained from the EEPROM 134 and written to the adjustable current source 224.

To autonomously calibrate the ramp generator 212, the example counter 248, the example comparator circuit 214 and the example latch 216 are reused (e.g., as the analog and digital circuits and devices 106 of FIG. 1) together with a small number of additional logic gates 108 (see FIG. 1) in the form of the multiplexer 252, the multiplexer 256, a calibration done detector 260, a multiplexer 262, and a multiplexer 264. In the illustrated example of FIGS. 2A and 2B, existing and/or reused circuits include a combination of analog and digital circuits and devices, and the new circuits are digital circuits that can be implemented by a small number (e.g., less than one hundred) of logic gates.

The reference clock CLK$_{REF}$ 116 provided by, for example, the ATE 112 (see FIG. 1) is coupled to an input terminal 252A of the multiplexer 252. The reference clock CLK$_{REF}$ 116 is output on an output terminal 252B of the multiplexer 252 when the CAL_EN bit 130, which is coupled to a control terminal 252C of the multiplexer 252, is high (e.g., a logic value of "1"). The CAL_EN bit 130 is set high by the ATE 112, or on-chip by on-chip digital logic 114 when the self-calibrating oscillator 200 is to autonomously self-calibrate. The first option is suited to be employed during assembly and test. The latter option can be employed when the oscillator during assembly and test, and/or in actual use environment. During self-calibration, the counter 248 counts through successive possible binary calibration codes (e.g., 0000, 0001, 0010, . . . ), and outputs the successive possible calibration codes onto an output bus 248C (e.g., serial, parallel, etc.). Additionally, and/or alternatively, trial calibration codes can be tried in other orders. For example, trial calibration codes can be generated based on the results of the trial(s) of other trial calibration codes (e.g., an output of the trim done detector 260). For example, trial calibration codes could be incremented in larger steps (e.g., by two, three, etc.) initially, and finer steps (e.g., by one) once an estimate of the necessary calibration code is identified. A processor, a state machine, etc. together with, in some examples, a digital-to-analog converter, could be used to generate trial calibration codes.

The CAL_EN bit 130 is also coupled to a control terminal 256A of a multiplexer 256. An input bus 256B of the multiplexer 256 is coupled to the output bus 248C of the counter 248, and another input bus 256C of the multiplexer 256 is coupled to the EEPROM 134. When the CAL_EN bit 130 is set high by the ATE 112, the input bus 256B of the multiplexer 256 is coupled to the adjustable current source 224 via an output bus 256D of the multiplexer 256, and carries successive calibration codes 249 from the counter 248 to the adjustable current source 224.

As described earlier, when output clock signal CLKR 218 is low, the voltage VCAP1 202 increases until it satisfies a threshold (e.g., exceeds reference voltage VREF 240). When voltage VCAP1 202 exceeds reference voltage VREF 240, output clock signal CLKR 218 becomes high. The amount of time it takes for voltage VCAP1 202 to exceed reference voltage VREF 240 depends on the amount of current output by the adjustable current source 224, and represents the operating frequency of the generator circuit 210. The larger the current output, the faster voltage VCAP1 202 increases and the higher the operating frequency of the generator circuit 210.

Figure 4:
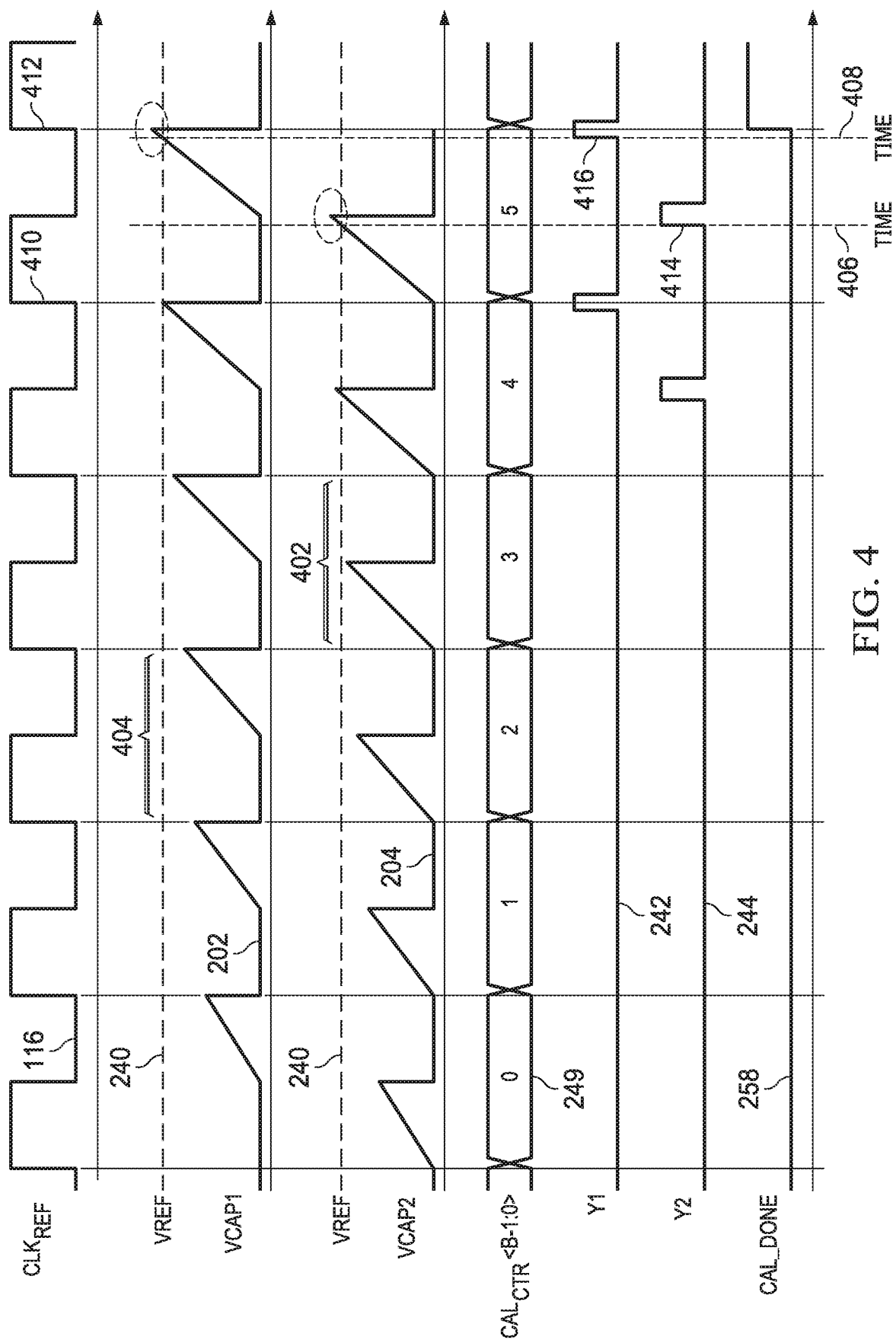
FIG. 4 is a graph of example signals illustrating an example self-calibration mode of operation of the example self-calibrating oscillator of FIG. 1, and/or FIGS. 2A and 2B.

The ramp generator 212 generates the voltage VCAP1 202 and the voltage VCAP2 204 in response to a received reference clock CLK$_{REF}$ 116 (instead of clock signal CLK$_{OSC}$ 206) having a known desired intended operating frequency for the generator circuit 210, then voltage VCAP1 202 and voltage VCAP2 204 will each meet the reference voltage VREF 240 between two rising edges of the reference clock CLK$_{REF}$ 116 when the adjustable current source 224 is correctly calibrated. In the example of FIG. 4, the reference clock CLK$_{REF}$ 116 is selected to be a 50% duty cycle clock. Hence, ideally, voltage VCAP1 202 and voltage VCAP2 204 satisfy VREF midway between two rising edges of the reference clock $CLK_{REF}$ 116. If the successive calibration codes 249 are tried in increasing order (see FIG. 4) the voltage VCAP1 202 and the voltage VCAP2 204 has a plurality of portions generated for different respective calibration codes. Portions of the voltage VCAP1 202 (e.g., a portion 402 for a calibration code 249 of 3) and voltage VCAP2 204 (e.g., a portion 404 for a calibration code 249 of 2) generated for respective calibration codes 249. The first calibration code (code 5 in FIG. 4) for which a respective portion of the voltage VCAP2 204 at least partially satisfies the threshold (e.g., meets or exceeds the reference voltage VREF 240) at time 406, and a respective portion of voltage VCAP1 202 at least partially satisfies a threshold (e.g., meets or exceeds the reference voltage VREF 240) at time 408 between two rising edges 410 and 412 of the reference clock $CLK_{REF}$ 116 is an identified calibration code 249 for which the output current results in the generator circuit 210 operating at desired intended operating frequency (e.g., within a predetermined range of the intended operating system that depends on the granularity of the calibration codes). Ideally, voltage VCAP1 202 and voltage VCAP2 204 satisfy VREF midway between two rising edges of the reference clock $CLK_{REF}$ 116. The calibration code corresponding to the output current that will result in the generator circuit 210 operating at desired intended operating frequency is the operating calibration code that will be using in a clock-generation mode of operation. A rising edge 414 of Y2 represents a measurement of voltage VCAP2 204 exceeding the reference voltage VREF 240, and a rising edge 416 of output Y1 242 represents a measurement of output voltage VCAP1 202 exceeding the reference voltage VREF 240. Because voltage VCAP1 202 and voltage VCAP2 204 are related to the oscillator frequency by F=IREF/(C*VREF), the voltage measurements of voltage VCAP1 202 and voltage VCAP2 204 reflect the operating frequency of the self-calibrating oscillator 200 when excited by a clock signal of the target or intended frequency. As shown in FIG. 4, voltage VCAP1 202 and voltage VCAP2 204 ramp successively faster as the calibration codes increase, thereby increasing the output current of the adjustable current source 224. When voltage VCAP1 202 and voltage VCAP2 204 each meet or exceed the reference voltage VREF 240 between two rising edges of the reference clock $CLK_{REF}$ 116, CAL_DONE 258 is set high (e.g., to a logic value of "1"). CAL_DONE 258 is coupled to a control terminal 134A of the EEPROM 134, and triggers the on-chip digital logic 114 to store the current calibration code (e.g., code 5 in the example of FIG. 4) in the EEPROM 134.

In the illustrated example of FIGS. 2A and 2B, FIG. 4 and FIG. 7, an example calibration done detector 260 detects when both voltage VCAP1 202 and voltage VCAP2 204 each meet or exceed the reference voltage VREF 240 between two rising edges of the reference clock $CLK_{REF}$ 116. The example calibration done detector 260 has a terminal 260A coupled to output Y1 242, a terminal 260B coupled to output Y2 244, and a terminal 260C coupled to CAL_DONE 258. When the example calibration done detector 260 detects rising edges of outputs Y1 242 and Y2 244 between rising edges of the reference clock $CLK_{REF}$ 116 the calibration done detector 260, for example, triggers the on-chip digital logic 114 to store the current calibration code (e.g., code 5 in the example of FIG. 4) in the EEPROM 134.

In the illustrative example of FIGS. 2A and 2B, FIG. 5 and FIG. 7, the calibration done detector 260 uses rising edges of both outputs Y1 242 and Y2 244 to balance ramp rate differences between voltage VCAP1 202 and voltage VCAP2 204. Additionally, and/or alternatively, self-calibrations performed based separately on outputs Y1 242 and Y2 244 can be performed and combined to determine a composite, balanced, etc. calibration code. For example, a calibration code for each of voltage VCAP1 202 and voltage VCAP2 204 can be determined. For example, a first calibration code could represent when voltage VCAP1 202 exceeds the reference voltage VREF 240, and a second calibration code could represent when voltage VCAP2 204 exceeds the reference voltage VREF 240. Differences between the first and second calibration codes represent random process variations during semiconductor fabrication.

Figure 5:
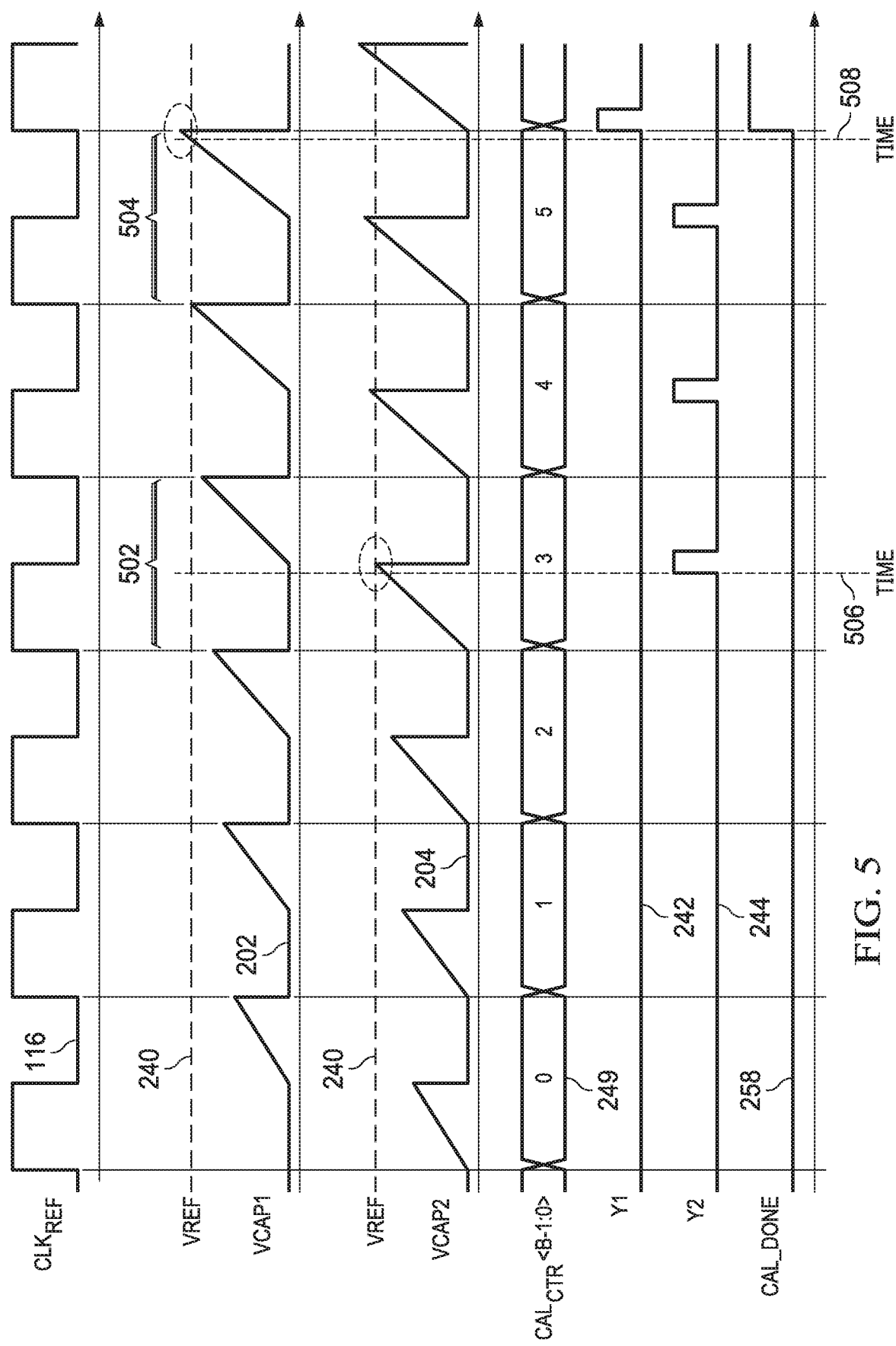
FIG. 5 is a graph of example signals illustrating another example self-calibration mode of operation of the example self-calibrating oscillator of FIG. 1, and/or FIGS. 2A and 2B.

In the example of FIG. 5, the reference clock $CLK_{REF}$ 116 is selected to be a 50% duty cycle clock. Hence, ideally, voltage VCAP1 202 and voltage VCAP2 204 satisfy VREF midway between two rising edges of the reference clock $CLK_{REF}$ 116. If the successive calibration codes 249 are tried in increasing order (see FIG. 4), the voltage VCAP1 202 and the voltage VCAP2 204 have a plurality of portions generated for different respective calibration codes. Portions of the voltage VCAP1 202 (e.g., a portion 502 for a calibration code 249 of 3) and the voltage VCAP2 204 (e.g., a portion 504 for a calibration code 249 of 5) are generated for respective calibration codes 249. A first calibration code (code 3 in FIG. 5) is the calibration code for which a respective portion of the voltage VCAP2 204 at least partially satisfies the threshold (e.g., meets or exceeds the reference voltage VREF 240) at time 506. A second calibration code (code 5 in FIG. 5) is the calibration code for which a respective portion of voltage VCAP1 202 at least partially satisfies a threshold (e.g., meets or exceeds the reference voltage VREF 240) at time 508. When voltage VCAP1 202 and voltage VCAP2 204 each meet or exceed the reference voltage VREF 240, CAL_DONE 258 is set high (e.g., to a logic value of "1"). CAL_DONE 258 is coupled to a control terminal 134A of the EEPROM 134, and triggers the on-chip digital logic 114 to store the current calibration codes (e.g., codes 3 and 5 in the example of FIG. 5) in the EEPROM 134. In some examples, a mean of the calibration codes is used. In some examples, both calibration codes are applied to the ramp generator 212. For instance, the first current source is used, when voltage VCAP1 202 is being generated, calibration code, and when voltage VCAP2 204 is being generated, the second calibration code could be applied. Alternatively, the first calibration code could be used for a first current source associated with the generation of voltage VCAP1 202, and the second calibration code could be used for a second current source associated with the generation of voltage VCAP2 204. The usage of two calibration codes is more efficient when the calibration codes are separated such that a mean of the calibration codes has a fractional component. For instance, when the calibration codes are 3 and 4, and the mean is 3.5. Because this fractional calibration code doesn't exist it would force a choice of either 3 or 4. However, at the expense of twice the memory storage, two separate calibration codes can be stored and applied for generating respective ones of voltage VCAP1 202 and voltage VCAP2 204, thereby achieving precise cancellation of comparator offset.

While an example manner of implementing the example self-calibrating oscillator 102 of FIG. 1 is illustrated in FIGS. 2A and 2B, one or more of the elements, processes and/or devices illustrated in FIGS. 2A and 2B may be combined, divided, re-arranged, omitted, eliminated and/or implemented in any other way. Further, the example self-calibrating oscillator 200 and/or the example calibration done detector 260 may be implemented by hardware, software, firmware and/or any combination of hardware, software and/or firmware. Thus, for example, the self-calibrating oscillator 200 and/or the example calibration done detector 260 could be implemented by one or more analog or digital circuit(s), logic circuits, programmable processor(s), programmable controller(s), Advanced RISC Machine (ARM) core(s), GPU(s), DSP(s), ASIC(s), PLD(s) and/or FPLD(s). When reading any of the apparatus or system claims of this patent to cover a purely software and/or firmware implementation, at least one of the example self-calibrating oscillator 200 and/or the example calibration done detector 260 is/are hereby expressly defined to include a non-transitory computer-readable storage device or storage disk such as a memory, a DVD, a CD, a Blu-ray disk, etc. including the software and/or firmware. Further still, the example self-calibrating oscillator 200 may include one or more elements, processes and/or devices in addition to, or instead of, those illustrated in FIGS. 2A and 2B, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 6:
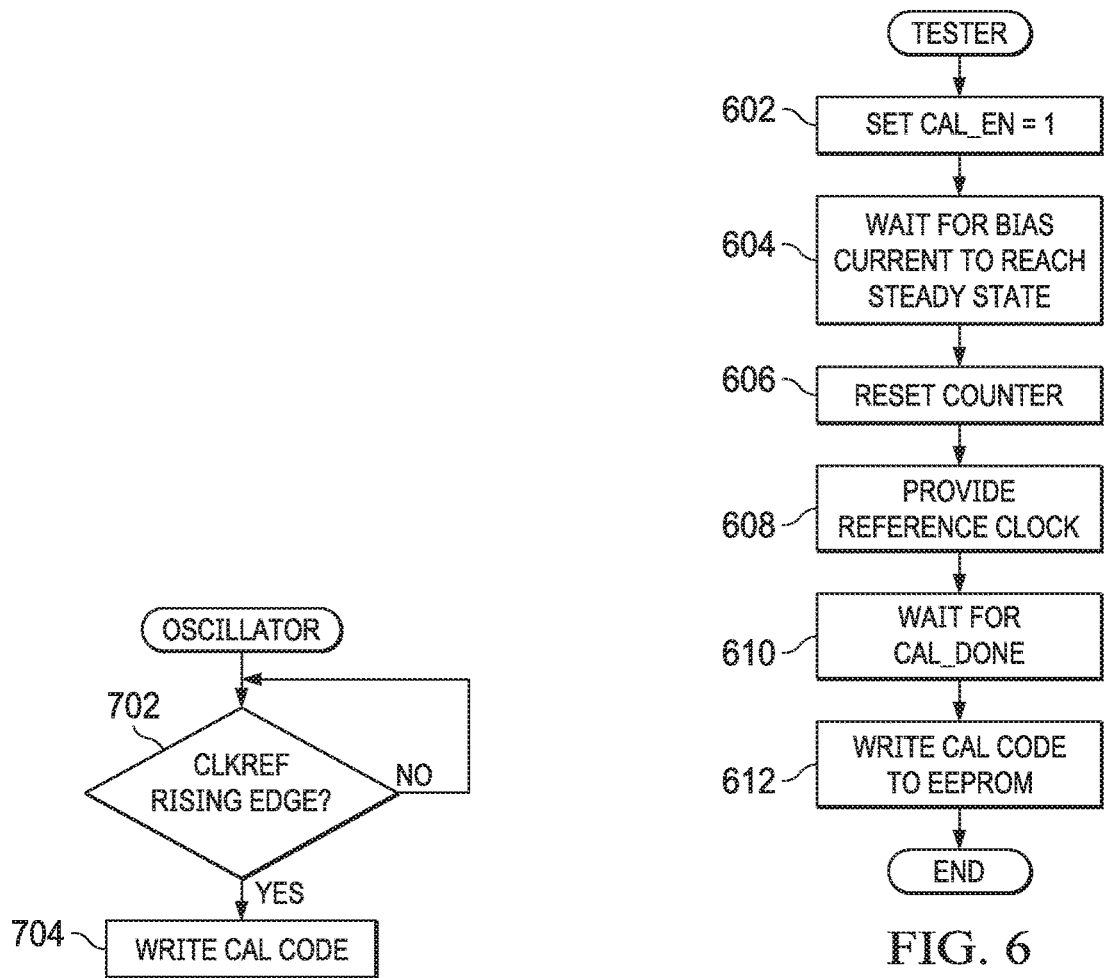
FIG. 6 is a flowchart representative of example hardware logic or machine-readable instructions for implementing the example automated test equipment of FIG. 1.

A flowchart representative of example hardware logic, machine-readable instructions, hardware implemented state machines, and/or any combination thereof for implementing the ATE 112 of FIG. 1 is shown in FIG. 6. The program of FIG. 6 could also be implemented partially and/or fully on-chip using digital logic. When implemented fully on a chip, the need for an external ATE may be obviated. The machine-readable instructions may be an executable program or portion of an executable program for execution by a computer processor such as the processor 810 shown in the example processor platform 800 discussed below in connection with FIG. 8. The program may be embodied in software stored on a non-transitory computer-readable storage medium such as a compact disc read-only memory (CD-ROM), a floppy disk, a hard drive, a DVD, a Blu-ray disk, or a memory associated with the processor 810, but the entire program and/or parts thereof could alternatively be executed by a device other than the processor 810 and/or embodied in firmware or dedicated hardware. Further, although the example program is described with reference to the flowchart illustrated in FIG. 6, many other methods of implementing the example ATE 112 may alternatively be used. For example, the order of execution of the blocks may be changed, and/or some of the blocks described may be changed, eliminated, or combined. Additionally, and/or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The program of FIG. 6 begins at block 502 with the ATE 112 writing the CAL_EN bit 130 to configure the self-calibrating oscillator 102, 200 for a self-calibration mode of operation (block 602). The ATE 112 waits for the adjustable current source 224 to reach steady state (block 604), and sets the counter 248 to an initial calibration code (block 606). The ATE 112 enables the reference clock $CLK_{REF}$ 116 by controlling the multiplexer 122 (block 608), and waits for CAL_DONE to be set (block 610). In some examples, the ATE 112 polls the registers 113 for CAL_DONE. In some example, the ATE 112 writes the calibration code 132 identified by the self-calibrating oscillator 102, 200 into the EEPROM 134 via the on-chip digital logic 114. In other examples, the self-calibrating oscillator 102, 200 writes the calibration code 132 in the EEPROM 134. Control exits from the example process of FIG. 6.

Figure 7:
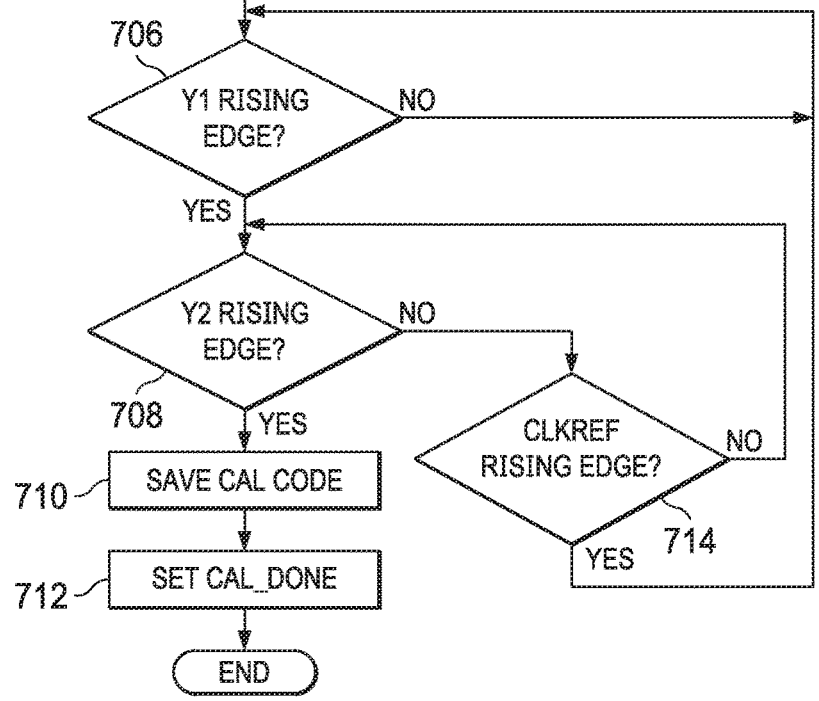
FIG. 7 is a flowchart representative of example hardware logic or machine-readable instructions for implementing the example self-calibrating oscillators of FIG. 1, and/or FIGS. 2A and 2B.

A flowchart representative of example hardware logic, machine-readable instructions, hardware implemented state machines, and/or any combination thereof for implementing the self-calibrating oscillator 102, 200 of FIG. 1 is shown in FIG. 7. The machine-readable instructions may be an executable program or portion of an executable program for execution by a computer processor such as the processor 810 shown in the example processor platform 800 discussed below in connection with FIG. 8. The program may be embodied in software stored on a non-transitory computer-readable storage medium such as a CD-ROM, a floppy disk, a hard drive, a DVD, a Blu-ray disk, or a memory associated with the processor 810, but the entire program and/or parts thereof could alternatively be executed by a device other than the processor 810 and/or embodied in firmware or dedicated hardware. Further, although the example program is described with reference to the flowchart illustrated in FIG. 7, many other methods of implementing the example self-calibrating oscillator 102, 200 may alternatively be used. For example, the order of execution of the blocks may be changed, and/or some of the blocks described may be changed, eliminated, or combined. Additionally, and/or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The program of FIG. 7 begins at block 702 with the self-calibrating oscillator 102, 200 in a self-calibration mode of operation waiting for a rising edge of the reference clock $CLK_{REF}$ 116 (block 702). When a rising edge of the reference clock $CLK_{REF}$ 116 occurs (block 702), a first calibration code 249 is written to the adjustable current source 224 (block 704). While not shown, for each subsequent rising edge of the reference clock $CLK_{REF}$ 116 the next calibration code 249 is written to the adjustable current source 224. The calibration done detector 260 waits for a rising edge of output Y1 242 (block 708). When a rising edge of output Y1 242 occurs (block 708), the calibration done detector 260 waits for a rising edge of output Y2 244 (block 710). When a rising edge of output Y2 244 occurs (block 710), the calibration done detector 260 stores the currently in-use calibration code 132 in the EEPROM 134 (block 710) and sets CAL_DONE (block 712). Control then exits from the example program of FIG. 7.

Returning to block 708, if a rising edge of the reference clock $CLK_{REF}$ 116 occurs (block 714) before a rising edge of output Y2 244 (block 708), control returns to block 706 to wait for next rising edge of output Y1 242 (block 706).

As mentioned above, the example processes of FIGS. 6 and 7 may be implemented using executable instructions (e.g., computer and/or machine-readable instructions) stored on a non-transitory computer and/or machine-readable medium such as a hard disk drive, a flash memory, a read-only memory, a CD-ROM, a DVD, a cache, a random-access memory and/or any other storage device or storage disk in which information is stored for any duration (e.g., for extended time periods, permanently, for brief instances, for temporarily buffering, and/or for caching of the information). As used herein, the term non-transitory computer-readable medium is expressly defined to include any type of computer-readable storage device and/or storage disk, to exclude propagating signals, and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C.

Figure 8:
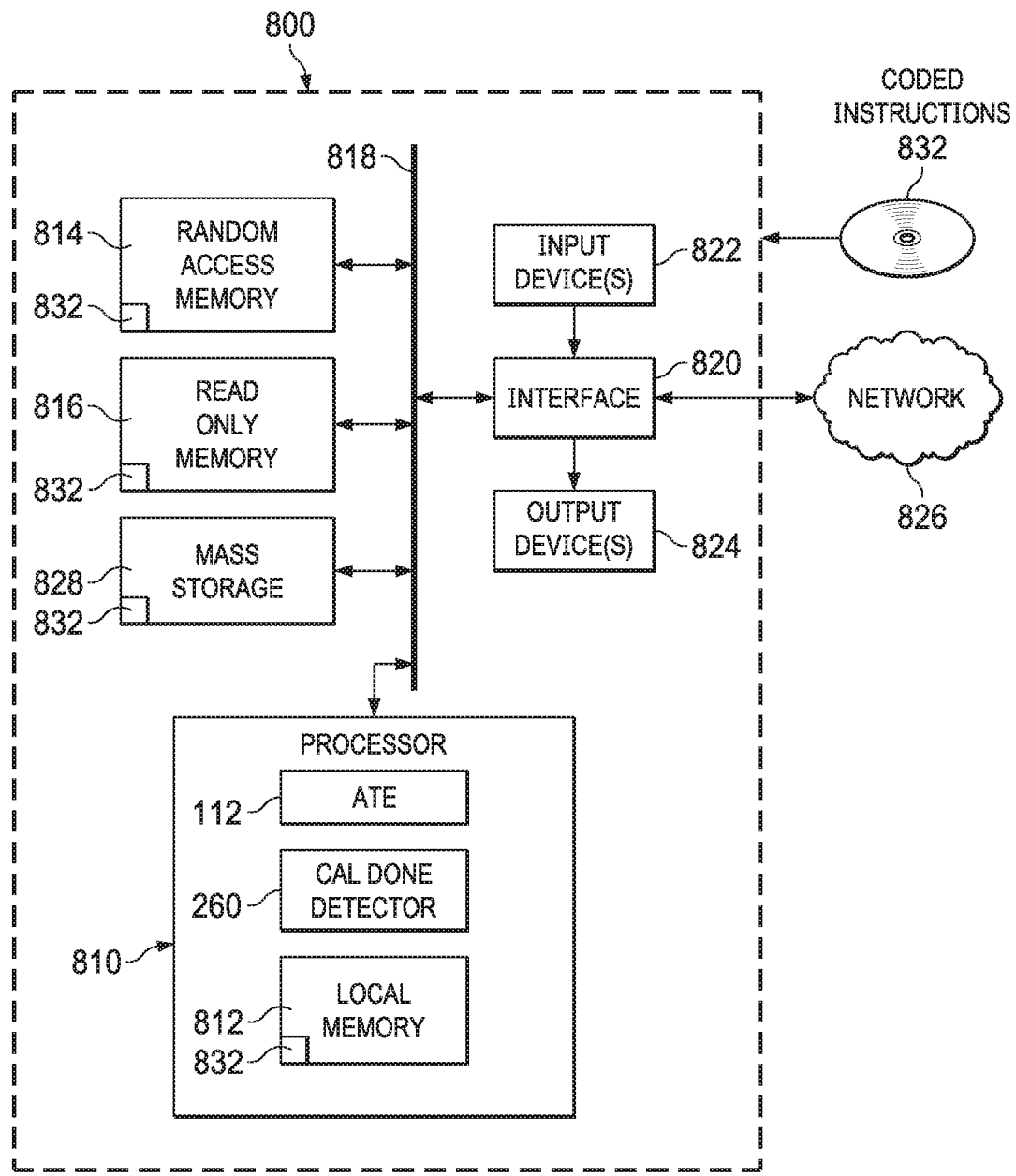
FIG. 8 illustrates an example processor platform structured to execute the example machine-readable instructions of FIG. 6 and FIG. 7 to implement the example self-calibrating environment of FIG. 1.

FIG. 8 is a block diagram of an example processor platform 800 structured to execute the instructions of FIGS. 6 and 7 to implement the ATE 112, and/or the self-calibrating oscillator 102, 200 of FIGS. 1 and 2. The processor platform 800 can be, for example, a server, a personal computer, a workstation, the example integrated circuit 104, or any other type of computing device including a processor.

The processor platform 800 of the illustrated example includes a processor 810. The processor 810 of the illustrated example is hardware. For example, the processor 810 can be implemented by one or more integrated circuits, logic circuits, microprocessors, ARM cores, GPUs, DSPs, or controllers from any desired family or manufacturer. The hardware processor may be a semiconductor based (e.g., silicon based) device. In this example, the processor implements the ATE 112, and the calibration done detector 260.

The processor 810 of the illustrated example includes a local memory 812 (e.g., a cache). The processor 810 of the illustrated example is in communication with a main memory including a volatile memory 814 and a non-volatile memory 816 via a bus 818. The volatile memory 814 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 816 may be implemented by flash memory and/or any other desired type of memory device. Access to the main memory 814, 816 is controlled by a memory controller.

The processor platform 800 of the illustrated example also includes an interface circuit 820. The interface circuit 820 may be implemented by any type of interface standard, such as an Ethernet interface, a universal serial bus (USB), a Bluetooth® interface, a near field communication (NFC) interface, and/or a PCI express interface.

In the illustrated example, one or more input devices 822 are connected to the interface circuit 820. The input device(s) 822 permit(s) a user to enter data and/or commands into the processor 810. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 824 are also connected to the interface circuit 820 of the illustrated example. The output devices 824 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 820 of the illustrated example, thus, typically includes a graphics driver card, a graphics driver chip and/or a graphics driver processor.

The interface circuit 820 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 826. The communication can be via, for example, an Ethernet connection, a digital subscriber line (DSL) connection, a telephone line connection, a coaxial cable system, a satellite system, a line-of-site wireless system, a cellular telephone system, etc.

The processor platform 800 of the illustrated example also includes one or more mass storage devices 828 for storing software and/or data. Examples of such mass storage devices 828 include floppy disk drives, hard drive disks, CD drives, Blu-ray disk drives, redundant array of independent disks (RAID) systems, and DVD drives.

Coded instructions 832 including the coded instructions of FIGS. 6 and 8 may be stored in the mass storage device 828, in the volatile memory 814, in the non-volatile memory 816, and/or on a removable non-transitory computer-readable storage medium such as a CD-ROM or a DVD.

From the foregoing, it will be appreciated that example self-calibrating oscillators, methods, apparatus and articles of manufacture have been disclosed that reduce the costs, complexity and time required to calibrate oscillators of integrated circuits. From the foregoing, it will be appreciated that methods, apparatus and articles of manufacture have been disclosed which enhance the operations of integrated circuits using self-calibrating oscillators. From the foregoing, it will be appreciated that methods, apparatus and articles of manufacture have been disclosed which lower the costs, complexity and time associated with manufacturing integrated circuits having self-calibrating oscillators.

Example self-calibrating oscillators and methods to self-calibration oscillators are disclosed herein. Further examples and combinations thereof include at least the following.

Example 1 is an integrated circuit includes an oscillator having a clock-generation mode of operation and a self-calibration mode of operation and including a generator to generate a voltage. The integrated circuit also including a comparator to compare the voltage to a threshold, a latch to generate an oscillating output clock responsive to outputs of the comparator, and a calibration done detector to adjust an operating frequency of the oscillator based on an output of the comparator.

Example 2 is the integrated circuit of example 1, wherein when the oscillator is in a clock-generation mode of operation, the generator is to generate the voltage based on the oscillating output clock.

Example 3 is the integrated circuit of example 1, wherein when the oscillator is in a self-calibration mode of operation, the generator is to generate the voltage based on a received reference clock.

Example 4 is the integrated circuit of example 1, wherein the calibration done detector is to adjust the operating frequency of the oscillator by determining whether the voltage exceeds the threshold for a calibration code for at least one of a current source, or a capacitor array of the generator.

Example 5 is the integrated circuit of example 1, further including a counter to generate successive trial calibration codes for at least one of a current source of the generator, or a capacitor array of the generator, wherein the calibration done detector is to select as an operating calibration code an active calibration code of the at least one of the current source, or the capacitor array when the voltage exceeds the threshold.

Example 6 is the integrated circuit of example 5, wherein the oscillator is to oscillate at approximately a frequency of a reference clock in a clock-generation mode of operation when the at least one of the current source, or the capacitor array is calibrated with the operating calibration code.

Example 7 is the integrated circuit of example 1, wherein the operating frequency is a first operating frequency, wherein the voltage is a first voltage, wherein the generator is to generate a second voltage, wherein the comparator is a first comparator, and outputs of the comparator are first outputs, further including a second comparator to compare the second voltage to the threshold, wherein the latch is to generate the oscillating output clock responsive to respective outputs of the first and second comparators, and wherein the calibration done detector is to adjust the first operating frequency of the oscillator based on first outputs of the first comparator, and a second operating frequency of the oscillator based on second outputs of the second comparator.

Example 8 is the integrated circuit of example 1, wherein the integrated circuit includes a power management integrated circuit.

Example 9 is the integrated circuit of example 1, wherein the integrated circuit includes a power management integrated circuit for a camera in an automobile.

Example 10 is the integrated circuit of example 1, further including an on chip clock source.

Example 11 is the integrated circuit of example 10, wherein the on chip clock source includes a second oscillator having a clock-generation mode of operation and a self-calibration mode of operation, the oscillator including a generator to generate a second voltage, a second comparator to compare the second voltage to a second threshold, a second latch to generate a second oscillating output clock responsive to outputs of the second comparator, and a second calibration done detector to adjust a second operating frequency of the second oscillator based on a second output of the second comparator.

Example 12 is a method of adjusting an operating frequency of an oscillator, including generating a voltage in response to a received reference clock, the voltage having a plurality of portions generated for different respective calibration codes of at least one of a current source, or a capacitor array, comparing the voltage to a threshold to identify a portion of the voltage at least partially satisfying the threshold, identifying as an operating calibration code the respective calibration code used to generate the identified portion of the voltage, and operating the oscillator with the operating calibration code to generate an output clock signal having an operating frequency similar to a frequency of the received reference clock.

Example 13 is the method of example 12, wherein operating the oscillator with the operating calibration code includes generating a second voltage in response to the output clock signal using the at least one of the current source, or the capacitor array calibrated with the operating calibration code, generating a third voltage in response to the output clock signal using the at least one of the current source, or the capacitor array calibrated with the operating calibration code, comparing the second voltage to the threshold, comparing the third voltage to the threshold, and forming the output clock signal based on an output of the comparing of the second voltage and the comparing of the third voltage.

Example 14 is the method of example 12, wherein when the oscillator is in a clock-generation mode of operation, the voltage is generated based on the output clock signal.

Example 15 is the method of example 12, wherein when the oscillator is in a self-calibration mode of operation, the voltage is generated based on a received reference clock.

Example 16 is the method of example 12, further including generating the different respective calibration codes as successive valued trial calibration codes for the at least one of the current source, or the capacitor array.

Example 17 is an integrated circuit including an adjustable current source having a first terminal, a transistor having a second terminal, a third terminal and a fourth terminal, the second terminal coupled to the first terminal, the third terminal coupled to a clock signal, a capacitor having a fifth terminal, the fifth terminal coupled to the fourth terminal, a comparator having a sixth terminal, a seventh terminal and an eighth terminal, the sixth terminal coupled to the fifth terminal, the seventh terminal coupled to a reference voltage, a latch having a ninth terminal and a tenth terminal, the eighth terminal coupled to the ninth terminal, the tenth terminal to output an output clock signal, a logic circuit having an eleventh terminal and a twelfth terminal, the eleventh terminal coupled to the eighth terminal, and a machine-readable memory having a thirteenth terminal, the twelfth terminal coupled to the thirteenth terminal.

Example 18 is the integrated circuit of example 17, further including a multiplexer having a fourteenth terminal, a fifteenth terminal and a sixteenth terminal, the fourteenth terminal coupled to tenth terminal, the fifteenth terminal coupled to a reference clock, the sixteenth terminal coupled to the third terminal.

Example 19 is the integrated circuit of example 17, further including a multiplexer having a fourteenth terminal, a fifteenth terminal and a sixteenth terminal, the fourteenth terminal coupled to the machine-readable memory, the fifteenth terminal coupled to the adjustable current source, and a counter having a seventeenth terminal and an eighteenth terminal, the seventeenth terminal coupled to sixteenth terminal, the eighteenth terminal coupled to a reference clock.

Example 20 is the integrated circuit of example 17, further including, a second transistor having a fourteenth terminal, a fifteenth terminal and a sixteenth terminal, the fourteenth terminal coupled to the first terminal, the fifteenth terminal coupled to a second clock signal, a second capacitor having a seventeenth terminal, the seventeenth terminal coupled to the sixteenth terminal, and a second comparator having a eighteenth terminal, a nineteenth terminal and an twentieth terminal, the eighteenth terminal coupled to the seventeenth terminal, the nineteenth terminal coupled to the reference voltage, wherein the latch has a twenty-first terminal coupled to the twentieth terminal.

Example 21 is the integrated circuit of example 17, further including a second transistor having a fourteenth terminal, and a fifteenth terminal, the fourteenth terminal coupled to the fifteenth terminal, the fifteenth terminal coupled to the clock signal.

Example 22 is an integrated circuit including a clock generator, a comparator having a first input connected to an output of the clock generator, and a second input connected to a reference voltage, and a calibration done detector having an input connected to an output of the comparator, and an output communicatively coupled to a calibration code register.

Example 23 is the integrated circuit of example 22, further including a latch having an input connected to the output of the comparator.

Example 24 is the integrated circuit of example 22, further including a calibration code generator having a control input connected to an output of the calibration done detector.

Example 25 is the integrated circuit of example 24, wherein the clock generator includes at least one of a current source having a first control input, or a capacitor array of the generator having a second control input, the calibration code register communicatively coupled to the at least one of the first control input, or the second control input.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An integrated circuit, comprising:
   a reference voltage input;
   a calibration code register;
   a clock generator having a clock generator output, the clock generator including at least one of a current source having a first control input or a capacitor array having a second control input, the calibration code register communicatively coupled to the first control input or the second control input;
   a comparator having a comparator output and first and second inputs, the first input connected to the clock generator output, and the second input connected to the reference voltage input;
   a calibration done detector having a detector input and a detector output, the detector input connected to the comparator output, and the detector output communicatively coupled to the calibration code register; and
   a calibration code generator having a control input connected to the detector output.

2. The integrated circuit of claim 1, further comprising a latch having an input connected to the comparator output.

3. An integrated circuit, comprising:
   an oscillator having a frequency adjustment input and an oscillator output, the oscillator configured to operate at an operating frequency in a clock-generation mode and a self-calibration mode, and the oscillator including a generator configured to generate an output voltage at the oscillator output;
   a comparator having a comparator output and first and second comparator inputs, the first comparator input coupled to the oscillator output, and the comparator configured to control the comparator output responsive to a comparison of a threshold voltage at the second comparator input to the output voltage;
   a latch having a latch input and a latch output, the latch input coupled to the comparator output, and the latch configured to generate an oscillating output clock at the latch output responsive to the comparator output; and
   a calibration done detector having a detector input and a detector output, the detector input coupled to the comparator output, the detector output coupled to the frequency adjustment input, and the calibration done detector configured to adjust the operating frequency of the oscillator based on the comparator output.

4. The integrated circuit of claim 3, wherein the generator has a clock input coupled to the latch output, and the generator is configured to generate the output voltage based on the oscillating output clock when the oscillator operates in the clock-generation mode.

5. The integrated circuit of claim 3, wherein the generator has a reference clock input and is configured to generate the output voltage based on the reference clock input when the oscillator operates in the self-calibration mode.

6. The integrated circuit of claim 3, wherein the calibration done detector is configured to adjust the operating frequency of the oscillator responsive to determining whether the output voltage exceeds the threshold voltage for a calibration code for at least one of a current source or a capacitor array of the generator.

7. The integrated circuit of claim 3, further comprising a counter configured to generate successive trial calibration codes for at least one of a current source of the generator or a capacitor array of the generator, wherein the calibration done detector is configured to select as an operating calibration code an active calibration code of the at least one of the current source or the capacitor array when the output voltage exceeds the threshold voltage.

8. The integrated circuit of claim 7, wherein the oscillator is configured to oscillate at approximately a frequency of a reference clock in the clock-generation mode when the at least one of the current source or the capacitor array is calibrated with the operating calibration code.

9. The integrated circuit of claim 3, wherein:
   the frequency adjustment input is a first frequency adjustment input, the oscillator output is a first oscillator output, and the operating frequency is a first operating frequency;
   the oscillator has a second frequency adjustment input and a second oscillator output, and the oscillator is configured to operate at a second operating frequency;
   the output voltage is a first output voltage;
   the generator is configured to generate a second output voltage at the second oscillator output;
   the comparator is a first comparator, and the comparator output is a first comparator output;
   the integrated circuit further comprises a second comparator having a second comparator output and third and fourth comparator inputs, the third comparator input coupled to the second oscillator output, and the second comparator configured to control the second comparator output responsive to a comparison of a threshold voltage at the fourth comparator input to the second output voltage;
   the latch input is a first latch input, the latch has a second latch input coupled to the second comparator output, and the latch is configured to generate the oscillating output clock at the latch output responsive to the first and second comparator outputs; and
   the detector input is a first detector input, and the detector output is a first detector output;
   the calibration done detector has a second detector input and a second detector output, the second detector input is coupled to the second comparator output, the second detector output is coupled to the second frequency adjustment input, and the calibration done detector is configured to adjust the second operating frequency of the oscillator based on the second comparator output.

10. The integrated circuit of claim 3, wherein the integrated circuit includes a power management integrated circuit.

11. The integrated circuit of claim 3, wherein the integrated circuit includes a power management integrated circuit for a camera in an automobile.

12. The integrated circuit of claim 3, further comprising an on-chip clock source.

13. The integrated circuit of claim 12, wherein the on-chip clock source includes:
a second oscillator having a second frequency adjustment input and a second oscillator output, the second oscillator configured to operate at a second operating frequency in a clock-generation mode and a self-calibration mode, and the second oscillator including a second generator configured to generate a second output voltage at the second oscillator output;
a second comparator having a second comparator output and third and fourth comparator inputs, the third comparator input coupled to the second oscillator output, and the second comparator configured to control the second comparator output responsive to a comparison of a second threshold voltage at the fourth comparator input to the second output voltage;
a second latch having a second latch input and a second latch output, the second latch input coupled to the second comparator output, and the second latch configured to generate a second oscillating output clock at the second latch output responsive to the second comparator output; and
a second calibration done detector having a second detector input and a second detector output, the second detector input coupled to the second comparator output, the second detector output coupled to the second frequency adjustment input, and the second calibration done detector configured to adjust the second operating frequency of the second oscillator based on the second comparator output.

14. A method of adjusting an operating frequency of an oscillator, the method comprising:
generating an output voltage in response to a reference clock, the output voltage having portions generated for different respective calibration codes of at least one of a current source or a capacitor array;
comparing the output voltage to a threshold voltage to identify a portion of the output voltage at least partially satisfying the threshold voltage;
identifying as an operating calibration code the respective calibration code used to generate the identified portion of the output voltage; and
operating the oscillator with the operating calibration code to generate an output clock signal having an operating frequency similar to a frequency of the reference clock.

15. The method of claim 14, wherein operating the oscillator with the operating calibration code includes:
generating a second output voltage in response to the output clock signal using the at least one of the current source or the capacitor array calibrated with the operating calibration code;
generating a third output voltage in response to the output clock signal using the at least one of the current source or the capacitor array calibrated with the operating calibration code;
comparing the second output voltage to the threshold voltage; and
comparing the third output voltage to the threshold voltage; and
forming the output clock signal based on the comparing of the second output voltage and the comparing of the third output voltage.

16. The method of claim 14, wherein the output voltage is generated based on the output clock signal when the oscillator operates in a clock-generation mode.

17. The method of claim 14, wherein the output voltage is generated based on the reference clock when the oscillator operates in a self-calibration mode.

18. The method of claim 14, further comprising generating the different respective calibration codes as successive valued trial calibration codes for the at least one of the current source or the capacitor array.

19. An integrated circuit comprising:
an adjustable current source having a first terminal;
a transistor having a second terminal, a third terminal and a fourth terminal, the second terminal coupled to the first terminal, the third terminal coupled to a clock signal input;
a capacitor having a fifth terminal, the fifth terminal coupled to the fourth terminal;
a comparator having a sixth terminal, a seventh terminal and an eighth terminal, the sixth terminal coupled to the fifth terminal, the seventh terminal coupled to a reference voltage input;
a latch having a ninth terminal and a tenth terminal, the eighth terminal coupled to the ninth terminal, the tenth terminal configured to output an output clock signal;
a logic circuit having an eleventh terminal and a twelfth terminal, the eleventh terminal coupled to the eighth terminal; and
a machine-readable memory having a thirteenth terminal, the twelfth terminal coupled to the thirteenth terminal.

20. The integrated circuit of claim 19, further comprising a multiplexer having a fourteenth terminal, a fifteenth terminal and a sixteenth terminal, the fourteenth terminal coupled to tenth terminal, the fifteenth terminal coupled to a reference clock input, the sixteenth terminal coupled to the third terminal.

21. The integrated circuit of claim 19, further comprising:
a multiplexer having a fourteenth terminal, a fifteenth terminal and a sixteenth terminal, the fourteenth terminal coupled to the machine-readable memory, the fifteenth terminal coupled to the adjustable current source; and
a counter having a seventeenth terminal and an eighteenth terminal, the seventeenth terminal coupled to sixteenth terminal, the eighteenth terminal coupled to a reference clock input.

22. The integrated circuit of claim 19, further comprising:
a second transistor having a fourteenth terminal, a fifteenth terminal and a sixteenth terminal, the fourteenth terminal coupled to the first terminal, the fifteenth terminal coupled to a second clock signal input;
a second capacitor having a seventeenth terminal, the seventeenth terminal coupled to the sixteenth terminal; and
a second comparator having a eighteenth terminal, a nineteenth terminal and an twentieth terminal, the eighteenth terminal coupled to the seventeenth terminal, the nineteenth terminal coupled to the reference voltage input, wherein the latch has a twenty-first terminal coupled to the twentieth terminal.

23. The integrated circuit of claim 19, further comprising a second transistor having a fourteenth terminal, and a fifteenth terminal, the fourteenth terminal coupled to the fifteenth terminal, the fifteenth terminal coupled to the clock signal input.

* * * * *